(12) United States Patent  
Oike et al.

(10) Patent No.: US 7,888,684 B2
(45) Date of Patent: Feb. 15, 2011

(54) LIGHT EMITTING DEVICE AND METHOD OF PRODUCING LIGHT EMITTING DEVICE WITH A SEMICONDUCTOR INCLUDES ONE OF CHALCOPYRITE AND OXYCHACOGENIDE

(75) Inventors: Tomoyuki Oike, Yokohama (JP); Tatsuya Iwasaki, Machida (JP); Toru Den, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 77 days.

(21) Appl. No.: 12/162,924

(22) PCT Filed: Mar. 15, 2007

(86) PCT No.: PCT/JP2007/055936

§ 371 (c)(1),
(2), (4) Date: Jul. 31, 2008

(87) PCT Pub. No.: WO2007/108526

PCT Pub. Date: Sep. 27, 2007

(65) Prior Publication Data

US 2009/0134427 A1 May 28, 2009

(30) Foreign Application Priority Data

Mar. 17, 2006 (JP) ............... 2006-074626
Mar. 12, 2007 (JP) ............... 2007-061869

(51) Int. Cl.
*H01L 31/0256* (2006.01)
*H01L 33/00* (2006.01)

(52) U.S. Cl. ......................... 257/76; 257/103

(58) Field of Classification Search ............ 257/76, 257/103, E33.013, E21.158
See application file for complete search history.

(56) References Cited

U.S. PATENT DOCUMENTS

| 5,008,891 A | 4/1991 | Morita | 372/45 |
| 5,043,774 A | 8/1991 | Shiki | 357/17 |
| 5,103,269 A | 4/1992 | Tomomura et al. | 357/17 |
| 5,250,814 A | 10/1993 | Morita | 257/13 |

(Continued)

FOREIGN PATENT DOCUMENTS

EP 0 555 722 8/1993

(Continued)

OTHER PUBLICATIONS

Chichibu, et al., "Fabrication of p-CuGaS$_2$/n-ZnO:Al heterojunction light-emitting diode grown by metalorganic vapor phase epitaxy and helicon-wave-excited-plasma sputtering methods", Journal of Physics and Chemistry of Solids, 66 pp. 1868-1871 (2005).

(Continued)

*Primary Examiner*—Matthew S Smith
(74) *Attorney, Agent, or Firm*—Fitzpatrick, Cella, Harper & Scinto (57) ABSTRACT

There has not been a DC drive type light emitting device capable of providing high brightness. The present invention provides a light emitting device, including: a pair of electrodes; a light emitter placed between the electrodes; and a semiconductor laminated to be adjacent to the light emitter, in which the semiconductor contains one of a chalcopyrite and an oxychalcogenide.

9 Claims, 6 Drawing Sheets

U.S. PATENT DOCUMENTS

| | | | |
|---|---|---|---|
| 5,593,335 A | 1/1997 | Suzuki et al. | 445/50 |
| 6,160,347 A | 12/2000 | Iwasaki et al. | 313/545 |
| 6,231,412 B1 | 5/2001 | Kawade et al. | 445/3 |
| 6,283,815 B1 | 9/2001 | Iwasaki et al. | 445/41 |
| 6,936,854 B2 | 8/2005 | Iwasaki et al. | 257/81 |
| 6,970,610 B2 | 11/2005 | Iwasaki | 385/14 |
| 6,972,146 B2 | 12/2005 | Den et al. | 428/138 |
| 7,214,418 B2 | 5/2007 | Den et al. | 428/138 |
| 7,282,268 B2 | 10/2007 | Fukutani et al. | 428/446 |
| 7,329,387 B2 | 2/2008 | Fukutani et al. | 422/82.01 |
| 7,411,209 B2 | 8/2008 | Endo et al. | 257/43 |
| 2005/0062033 A1 | 3/2005 | Ichihara et al. | 257/17 |
| 2006/0043410 A1 | 3/2006 | Iwasaki et al. | 257/103 |
| 2008/0023880 A1 | 1/2008 | Imada et al. | 264/293 |
| 2008/0076201 A1 | 3/2008 | Fukutani et al. | 438/49 |

FOREIGN PATENT DOCUMENTS

| | | |
|---|---|---|
| EP | 1 489 654 | 12/2004 |
| EP | 1 622 207 | 2/2006 |
| JP | 61075573 * | 4/1986 |

OTHER PUBLICATIONS

Koyayashi, et al., "DC Green Electroluminescent of Al-CuGaS$_2$ Diode", Jpn. J. Appl. Phys. vol. 31, Part 2, No. 11B, pp. L 1606-L 1608 (1992).

Kobayashi et al., "Green Electroluminescene from ZnS-CuGaS$_2$ Heterojunction Diode in DC Operation", Jpn. J. Appl. Phys., vol. 30, No. 10A, pp. L 1747-L 1749 (1991).

Hiramatsu, et al., "Excitonic blue luminescence from p-LaCuOSe/n-InGaZn$_5$O$_8$ light-emitting diode at room temperature", Applied Physics Letters 87, pp. 211107 (2005).

Hiramatsu et al., "Opto-electronic Properties and Light-emitting Device Application of Widegap Layered Oxychalcogenides: LaCuO$Ch$ ($Ch$=chalcogen) and La$_2$CdO$_2$Se$_2$," Phys. Stat. Sol. (a) 203, No. 11, pp. 2800-2811 (2006).

PCT Notification Concerning Transmittal of International Preliminary Report on Patentability (Chapter I of the Patent Cooperation Treaty) (Form PCT/IB/326); International Preliminary Report on Patentability (Chapter I of the Patent Cooperation Treaty) (Form PCT/IB/373); Written Opinion of The International Searching Authority (Form PCT/ISA/220), regarding International Application No. PCT/JP2007/055936.

* cited by examiner

AFTER HEAT TREATMENT

LIGHT EMITTING DEVICE AND METHOD OF PRODUCING LIGHT EMITTING DEVICE WITH A SEMICONDUCTOR INCLUDES ONE OF CHALCOPYRITE AND OXYCHACOGENIDE

TECHNICAL FIELD

The present invention relates to a light emitting device and a method of producing a light emitting device, in particular, a light emitting device capable of emitting light with high brightness and a method of producing the light emitting device.

BACKGROUND ART

The development of a light emitting device capable of emitting light with high brightness has shown significant progress in recent years.

The following kinds of light emitting devices are available.

An LED and an LD emit light by injecting an electron and a hole into a semiconductor pn junction formed of a high-quality crystal and recombining the electron and the hole.

An inorganic EL causes electrical field excited light emission by applying a high electric field to an insulating phosphor thin film and exciting a light emitting center in the phosphor thin film with hot electrons.

An organic EL is obtained by laminating a light emitting layer, an electron transporting layer, and a hole transporting layer formed of an organic molecule or a polymer thin film. The organic EL causes exciton light emission localized in an organic molecule with the energy of recombination between an injected electron and an injected hole.

An LED and an organic EL capable of emitting light with high brightness through a direct current drive are each requested to not only have higher brightness but also be developed to be more simple with excellent productivity and high durability.

Japanese Journal of Applied Physics 31, L 1606, 1992 discloses a DC drive type light emitting device using a chalcopyrite semiconductor, the light emitting device being of an MIS type diode constitution formed of $Al/ZnS/CuGaS_2$. In this light emitting device, an electron is injected through a Schottky barrier between a metal layer and an insulating layer, whereby green light having weak intensity is emitted in a semiconductor layer.

In addition, Journal of Physics and Chemistry of Solids 66, 1868, 2005 discloses a constitution in which a heterojunction diode obtained by laminating a p-type $CuGaS_2$ chalcopyrite semiconductor layer and an n-type ZnO:Al compound semiconductor layer is sandwiched between metals different from each other in work function. Attempts have been made to produce a DC drive type light emitting device having this constitution. At present, however, only light having weak intensity can be emitted from such device.

DISCLOSURE OF THE INVENTION

However, the above-mentioned light emitting device of the prior art cannot provide high brightness.

In view of the foregoing, the present invention provides a DC drive type light emitting device capable of providing high brightness.

Therefore, according to the present invention, there is provided a light emitting device, including:

a pair of electrodes;

a light emitter placed between the electrodes; and a semiconductor laminated to be adjacent to the light emitter, in which the semiconductor contains one of a chalcopyrite and an oxychalcogenide.

Further, according to the present invention, there is provided a method of producing a light emitting device in which a semiconductor containing one of a chalcopyrite and an oxychalcogenide and a light emitter in which a compound semiconductor provided with a donor and an acceptor emits light are laminated to be adjacent to each other, the method including:

a first step of forming a precursor by placing a first member to be the semiconductor and a second member to be a base material for the light emitter so that the first member and the second member are adjacent to each other; and a second step of subjecting the precursor to a heat treatment.

The incorporation of one of a chalcopyrite and an oxychalcogenide into a semiconductor adjacent to a light emitter facilitates the injection of an electron or a hole from the semiconductor into the light emitter. As a result, a light emitting device capable of emitting light with high brightness can be provided.

Further features of the present invention will become apparent from the following description of exemplary embodiments with reference to the attached drawings.

BEST MODE FOR CARRYING OUT THE INVENTION

Embodiment 1

Hereinafter, an exemplary embodiment for carrying out the present invention will be described with reference to the accompanying drawings.

Figure 1:
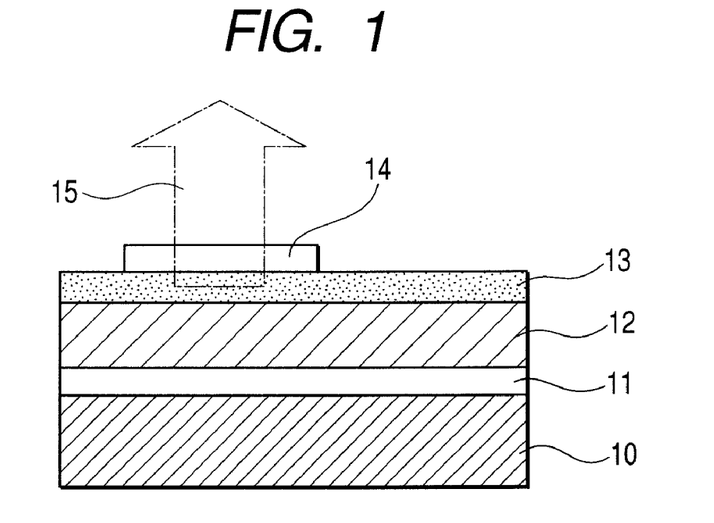
FIG. 1 is a sectional view showing a schematic constitution of a light emitting device as an embodiment of the present invention.

FIG. 1 is a sectional view showing a schematic constitution of a light emitting device as an embodiment of the present invention.

As shown in FIG. 1, the light emitting device of this embodiment is obtained by laminating an anode 11 on a substrate 10 and further laminating thereon a semiconductor containing a chalcopyrite (hereinafter referred to as "chalcopyrite semiconductor") 12, a donor-acceptor pair light emitter 13, and a cathode 14.

A unit cell of the crystalline structure of a compound represented by a I-III-VI$_2$ type among a large number of existing chalcopyrites is a tetragonal system obtained by stacking two sphalerite structures such as ZnS as a representative example of the group II-VI in the c-axis direction.

The band structure shows a direct transition type, and selection of constituent elements allows the band gap to be adjusted in a wide range from 0.96 to 3.49 eV.

The lattice constant can be adjusted in the range of 0.531 to 0.641 nm, lattice matching with ZnS (0.541 nm) or the like is excellent, and the degree of freedom in the selection of a material is extremely high.

A chalcopyrite to be used here is represented by the I-III-VI$_2$ type, and one or more materials are chosen from Cu and Ag for the group I, one or more materials are selected from Al, Ga, and In for the group III, and one or more materials are selected from S, Se, and Te for the group VI.

A wide gap semiconductor is favorable in order to obtain visible light by supplying a carrier to the donor-acceptor pair light emitter. The term "wide gap semiconductor" as used herein generally refers to a semiconductor having a band gap twice or more as wide as that of silicon, that is, a semiconductor having a band gap of 2.2 eV or more.

Examples of the wide gap semiconductor include CuAlS$_2$ (Eg=3.49 eV), CuAlSe$_2$ (Eg=2.67 eV), and CuGaS$_2$ (Eg=2.43 eV). The examples further include AgAlS$_2$ (Eg=3.13 eV), AgAlSe$_2$ (Eg=2.55 eV), AgAlTe$_2$ (Eg=2.27 eV), and AgGaS$_2$ (Eg=2.73 eV).

Many chalcopyrite semiconductors show both the p-type and n-type conduction types owing to the holes and defects of constituent elements. In particular, they can provide p-type conduction which is difficult to obtain in, for example, the group II-VI wide band gap compound semiconductor.

In order to obtain satisfactory donor-acceptor pair luminescence, the light emitting device favorably has p-type conductivity with which holes can be injected at a density of $1\times10^{15}$ cm$^{-3}$ or more.

The donor-acceptor pair light emitter emits light via the following mechanism: the respective energy levels are formed by a donor and an acceptor added to a semiconductor as a base material, and the electrons and holes trapped in the levels recombine to emit light.

Such light emission occurs in many semiconductors such as SiC (group IV-IV), GaP, GaAs (group III-V), ZnS, ZnSe, and CdS (group II-VI). In particular, light emitted from a deep donor-acceptor pair formed in a ZnS base material is bright even at room temperature, so such material is finding use in a wide variety of applications typified by a phosphor for a color-television cathode-ray tube. Examples of such phosphor include a ZnS:Ag,Cl blue phosphor and a ZnS:Cu,Al green phosphor.

The donor-acceptor pair light emitter to be used here can emit visible light as long as the light emitter uses ZnS (Eg=3.7 eV), which is a wide gap semiconductor, as its base material.

The light emitter is represented by ZnS:A,D, one or more materials are selected from Au, Ag, Cu, and N for 'A' (acceptor), and one or more materials are selected from Al, Ga, In, F, Cl, Br, and I for 'D' (donor). The emission color is determined by energy difference between the donor level and the acceptor level to be formed.

For example, light emission having a peak wavelength at about 2.4 eV is obtained with ZnS:Cu,Al, light emission having a peak wavelength at about 2.7 eV is obtained with ZnS:Cu,Cl, and light having a peak wavelength at about 2.85 eV is emitted in ZnS:Ag,Al.

The donor concentration and the acceptor concentration each have an optimum concentration at which high emission brightness can be obtained with such a range that no concentration quenching occurs. For example, in the case of ZnS:Cu,Al, the concentration of Al as a donor is about $2\times10^{-4}$ mol/mol, and the concentration of Cu as an acceptor is about $1.2\times10^{-4}$ mol/mol. In addition, in the case of ZnS:Ag,Cl, the concentration of Cl as a donor is about $7\times10^{-5}$ mol/mol, and the concentration of Ag as an acceptor is about $1.8\times7\times10^{-4}$ mol/mol.

In general, the donor-acceptor concentration is favorably $10^{-3}$ mol/mol or less.

Although there are various kinds of donor-acceptor combinations, a material in common with an element selected from the elements belonging to the groups I and III for constituting the chalcopyrite semiconductor is favorably selected because of the following reason: material diffusion from a chalcopyrite due to a heat treatment in a method of producing a light emitting device to be described later enables the formation of the donor-acceptor pair light emitter.

When the donor and the acceptor are materials different from the elements belonging to the groups I and III for constituting the chalcopyrite semiconductor, or when the donor and the acceptor are different from each other in extent of material diffusion caused by a heat treatment, the donor-acceptor pair light emitter can be produced by the following method.

That is, one of the materials is added in advance as an additive to the base material.

The addition finally results in the formation of the donor-acceptor pair light emitter.

In order that a light emitting device emits light with higher brightness, the crystallinity of the donor-acceptor pair light emitter is favorably high. To obtain high crystallinity, lattice matching between the crystalline structures of the chalcopyrite semiconductor and of the donor-acceptor pair light emitter is of concern.

Examples of the chalcopyrite semiconductor adjacent to the donor-acceptor pair light emitter when the light emitter is of ZnS (having a lattice constant of 0.541 nm) are shown below.

The examples include CuAlS$_2$ (0.531 nm), CuAlSe$_2$ (0.560 nm), and CuGaS$_2$ (0.535 nm). The examples further include AgAlS$_2$ (0.570 nm), AgAlSe$_2$ (0.596 nm), AgAlTe$_2$ (0.630 nm), and AgGaS$_2$ (0.574 nm).

Lattice matching between them ranges from 1.11 to 16.5%. In such range, 10% or less is favorable.

The light emitting device of this embodiment is a DC drive type light emitting device in which an electrode on the side of the chalcopyrite semiconductor is connected to a positive electrode and an electrode on the side of the donor-acceptor pair light emitter is connected to a negative electrode so that the donor-acceptor pair light emitter emits light.

That is, when a DC voltage is applied to the light emitting device as shown in FIG. 1, a hole is supplied from the anode 11 on the side of the chalcopyrite semiconductor, and an electron is supplied from the cathode 14 on the side of the donor-acceptor pair light emitter 13, whereby the donor-acceptor pair light emitter 13 emits light.

Examples of a material for the anode 11 include metals and p-type semiconductors each having a large work function close to the valence band of the chalcopyrite semiconductor, such as Pt, Ni, Au, ITO, Cu, and Pd.

Examples of a material for the cathode 14 include alkali metals, alkali earth metals, materials belonging to the group III, and n-type semiconductors each having a small work function, such as Li, Ca, Mg, Al, LiF/Al, MgAg/Ag, ZnO:Al, ZnO:Ga, InGaZnO$_4$, and In$_2$O$_3$:ZnO.

Figure 2:
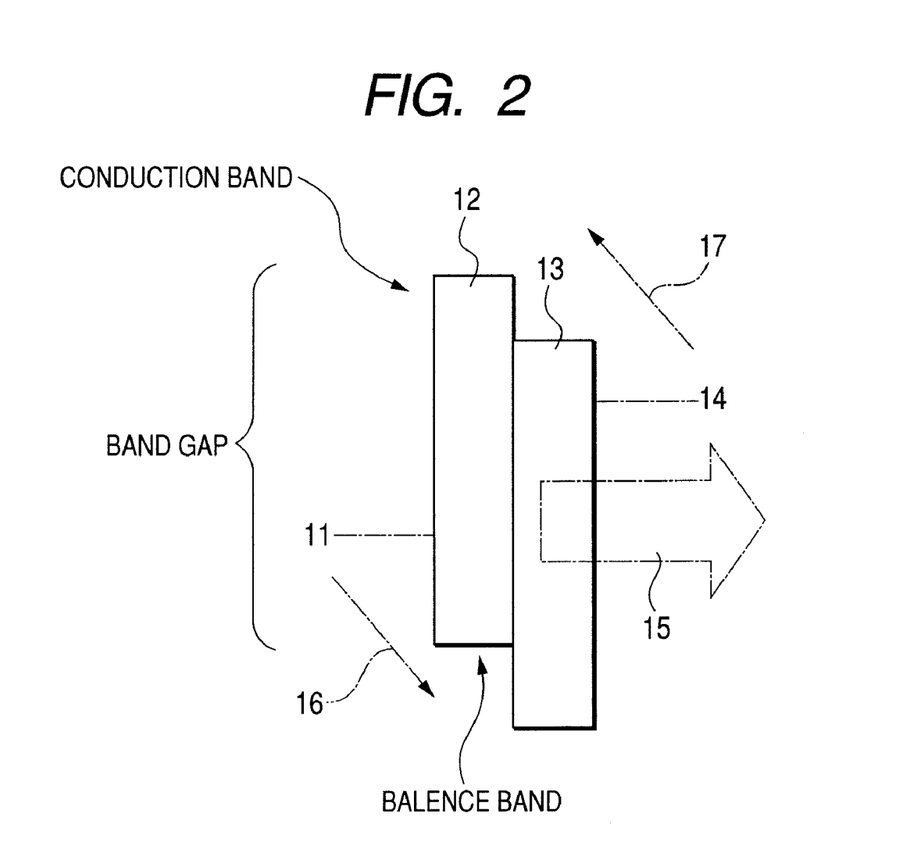
FIG. 2 is a view showing the energy band structure of the light emitting device as the embodiment of the present invention.

With such constitution, as shown in FIG. 2, a hole 16 is supplied and transported from the anode 11 into the chalcopyrite semiconductor 12, and an electron 17 is supplied from the cathode 14.

Then, the hole and the electron recombine in the donor-acceptor pair light emitter 13, whereby light emission 15 having high brightness can be obtained.

Figure 3:
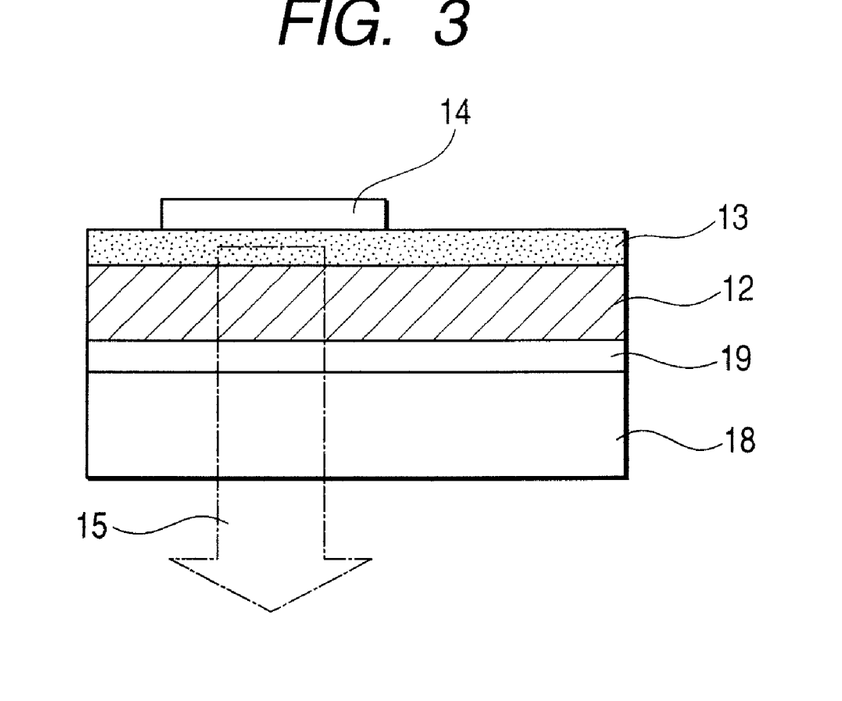
FIG. 3 is a sectional view showing the schematic constitution of the light emitting device as the embodiment of the present invention.

The light emission 15 can be extracted to the outside of the light emitting device through a transparent electrode. A constitution using a transparent substrate 18 as shown in FIG. 3 enables the emitted light to be extracted in the direction of the light emission 15.

Figure 4:
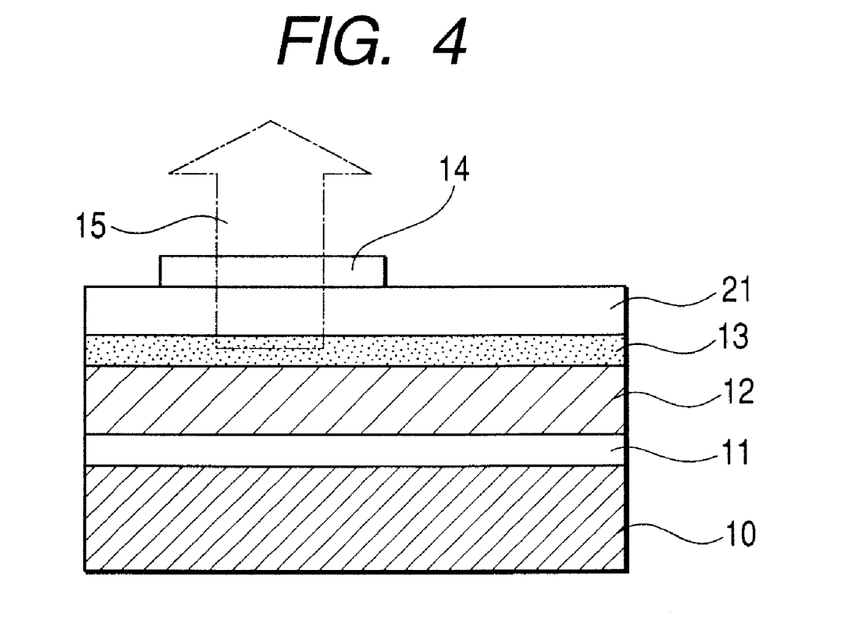
FIG. 4 is a sectional view showing a schematic constitution of the light emitting device as the embodiment of the present invention.

A constitution in which an n-type semiconductor 21 is provided between the cathode 14 and the donor-acceptor pair light emitter 13 as shown in FIG. 4 is also usable.

Figure 5:
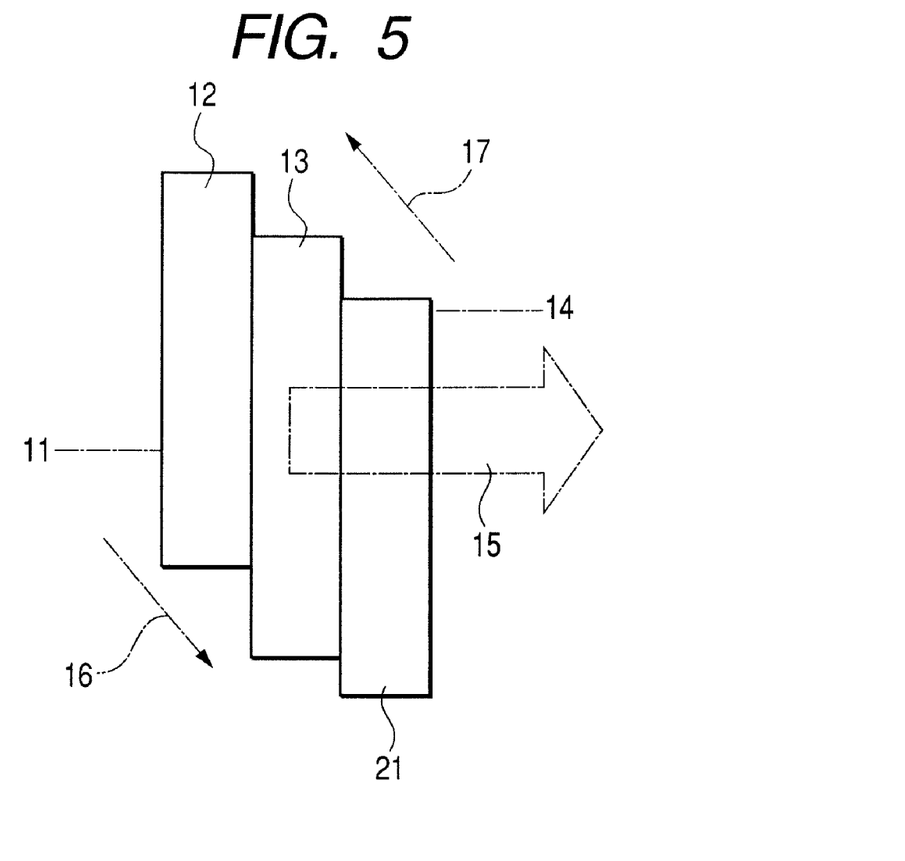
FIG. 5 is a view showing the energy band structure of the light emitting device as the embodiment of the present invention.

With such constitution, as shown in FIG. 5, the hole 16 is supplied and transported from the anode 11 into the chalcopyrite semiconductor 12, and the electron 17 is supplied and transported from the cathode 14 into the n-type semiconductor 21. Then, the hole and the electron recombine in the donor-acceptor pair light emitter 13, whereby the light emission 15 having high brightness can be obtained.

Figure 6:
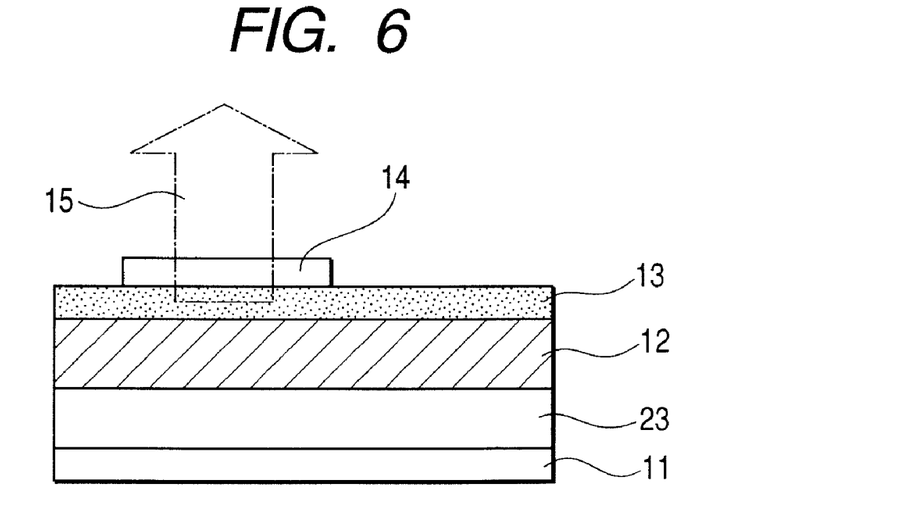
FIG. 6 is a sectional view showing the schematic constitution of the light emitting device as the embodiment of the present invention.

Alternatively, a constitution in which a p-type semiconductor 23 is provided between the anode 11 and the chalcopyrite semiconductor 12 as shown in FIG. 6 is also usable.

Figure 7:
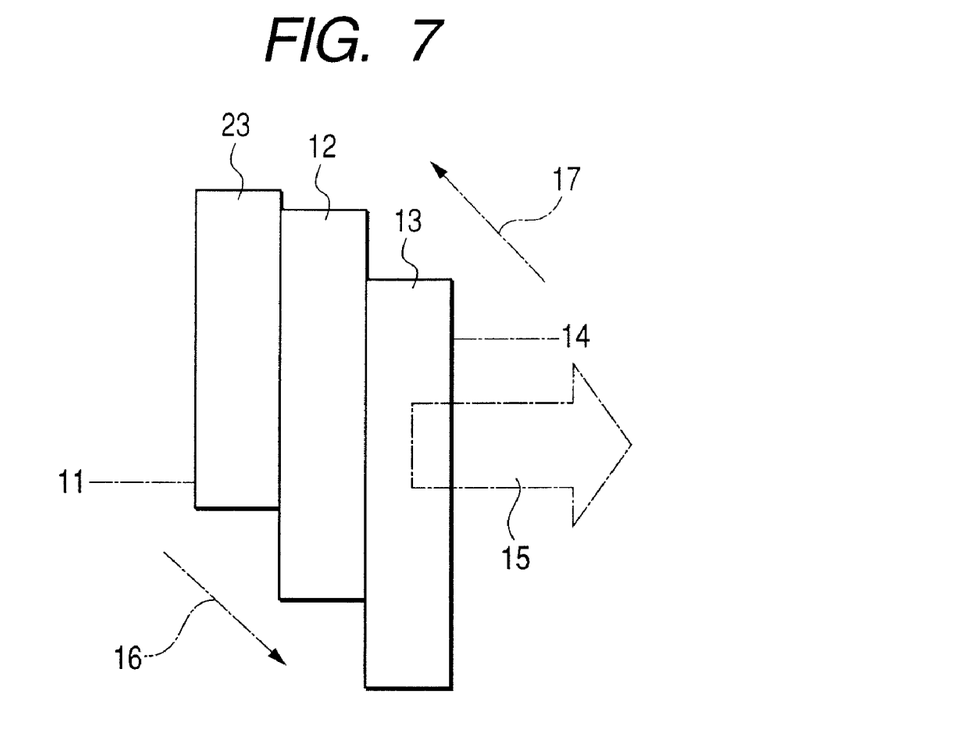
FIG. 7 is a view showing the energy band structure of the light emitting device as the embodiment of the present invention.

With such constitution, as shown in FIG. 7, the hole 16 is supplied and transported from the anode 11 into the chalcopyrite semiconductor 12 through the p-type semiconductor 23, and the electron 17 is supplied from the cathode 14. Then, the hole and the electron recombine in the donor-acceptor pair light emitter 13, whereby the light emission 15 having high brightness can be obtained.

Further, a constitution provided with both the n-type semiconductor 21 and the p-type semiconductor 23 described above is also usable.

Figure 8:
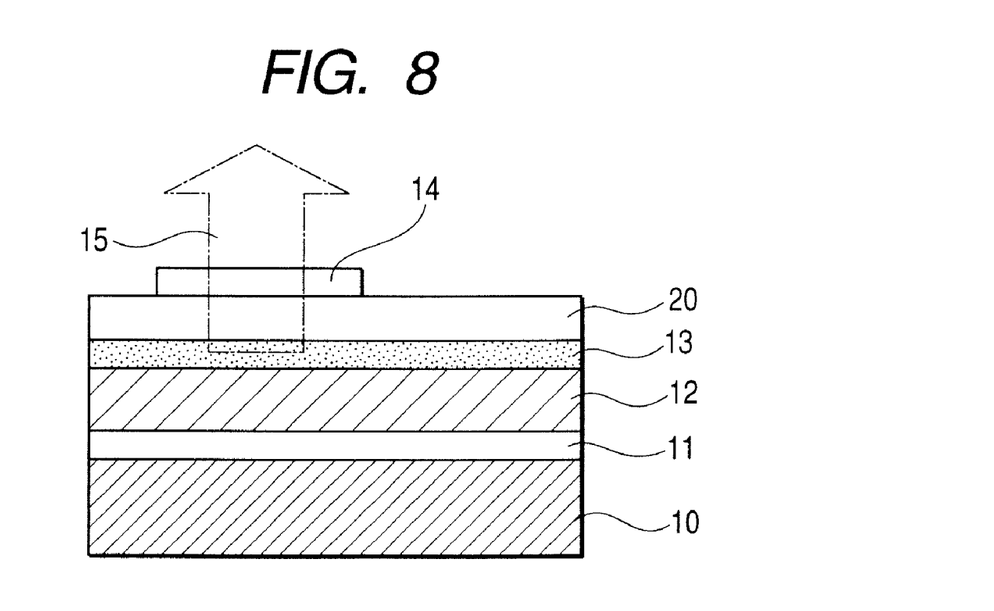
FIG. 8 is a sectional view showing the schematic constitution of the light emitting device as the embodiment of the present invention.

In addition, a constitution in which an insulator 20 is provided between the cathode 14 and the donor-acceptor pair light emitter 13 as shown in FIG. 8 is also usable.

Figure 9:
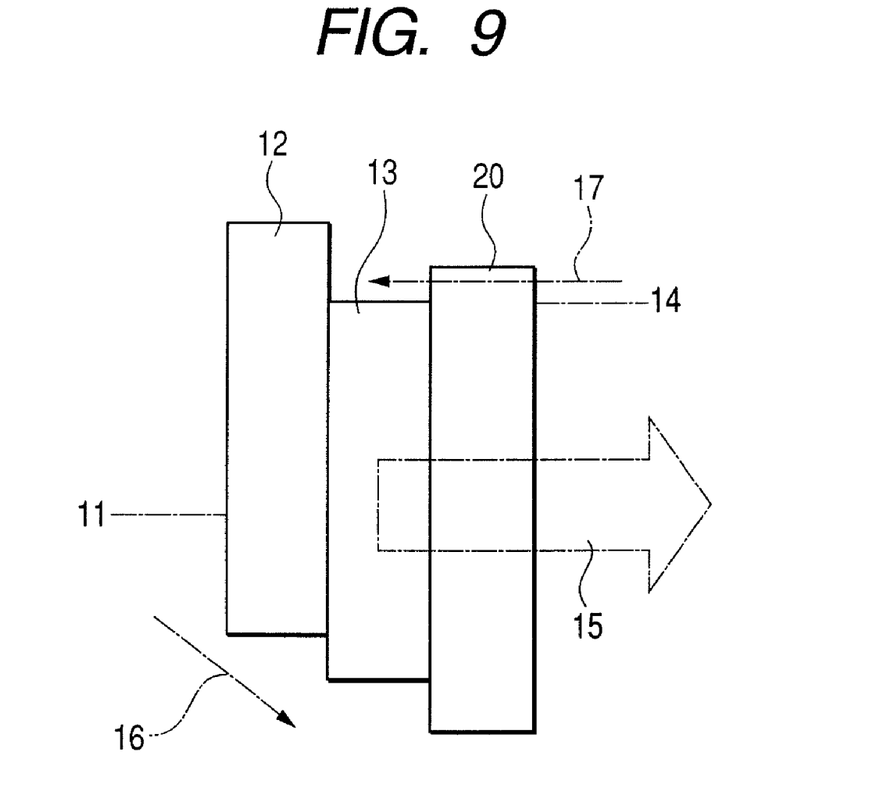
FIG. 9 is a view showing the energy band structure of the light emitting device as the embodiment of the present invention.

With such constitution, as shown in FIG. 9, the hole 16 is supplied and transported from the anode 11 into the chalcopyrite semiconductor 12, and the electron 17 is injected through a Schottky barrier comprised of the cathode 14 and the insulator 20. Then, the hole and the electron recombine in the donor-acceptor pair light emitter 13, whereby the light emission 15 having high brightness can be obtained.

(Method of Producing Light Emitting Device)

The first step of a production method of this embodiment, that is, a step of forming a precursor by placing a first member formed of a chalcopyrite semiconductor and a second member formed of a base material for a donor-acceptor pair light emitter so that the first and second members are adjacent to each other will be described.

Figure 10:
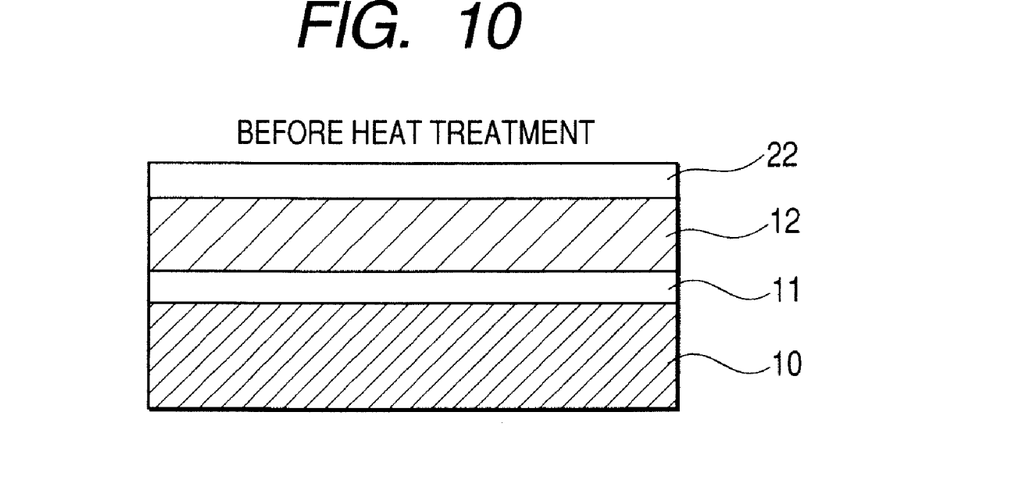
FIG. 10 is a schematic sectional view showing a state before a heat treatment in the second step of a method of producing a light emitting device of the present invention.

As shown in FIG. 10, the anode 11 is placed on the substrate 10, and the chalcopyrite semiconductor 12 is formed thereon.

Examples of a method of forming the chalcopyrite semiconductor of this embodiment include a multi-source deposition method, a sulfidization, selenidization, or telluridization method, a solid phase growth method, a metal organic chemical vapor deposition method, a vapor phase growth method, a sputtering method, and a laser ablation method. Of those, the multi-source deposition method is advantageous in terms of composition controllability, and the sputtering method is effective in terms of convenience.

Raw materials for the chalcopyrite semiconductor, which may each be supplied in the form of a sulfide, selenide, or telluride, are partially or entirely supplied as metal materials, and are then heated in a hydrogen sulfide, hydrogen selenide, or hydrogen telluride atmosphere. Thus, each of the materials can be turned into a sulfide, a selenide, or a telluride.

A base material 22 for a donor-acceptor pair light emitter is formed on the chalcopyrite semiconductor 12 to obtain a precursor.

Examples of a method of forming the base material for a donor-acceptor pair light emitter of this embodiment include a multi-source deposition method, a solution growth method, a metal organic chemical vapor deposition method, a vapor phase growth method, a sputtering method, and a laser ablation method. Of those, the sputtering method and the solution growth method are favorable in terms of convenience, and, when an additive is added, the multi-source deposition method and the laser ablation method are favorable. It should be noted that an additive can be added by an ion implantation method before or after the formation of the base material.

The second step of the production method of this embodiment, that is, a step of forming a donor-acceptor pair light emitter at a portion where the first and second members are adjacent to each other by subjecting the precursor to a heat treatment will be described.

Figure 11:
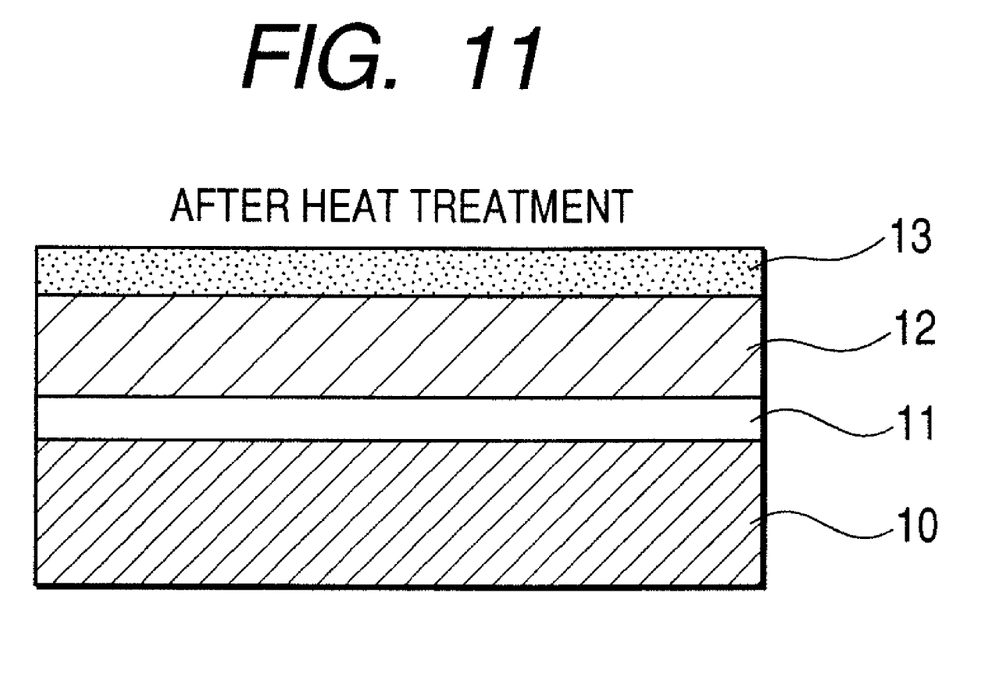
FIG. 11 is a schematic sectional view showing a state after the heat treatment in the second step of the method of producing a light emitting device of the present invention.

The heat treatment causes material diffusion from the chalcopyrite semiconductor 12 toward the base material 22 for a donor-acceptor pair light emitter, whereby the precursor is turned into the donor-acceptor pair light emitter 13 of FIG. 11.

Although the heat treatment can be performed with, for example, a general electric furnace as long as an atmosphere for the treatment can be controlled, the treatment is favorably performed by a rapid heating method with which a time period for heating and cooling can be controlled in order that the extent or range of material diffusion due to heat may be controlled with improved accuracy. In addition, a lamp or laser as well as a heater may be used as heating means.

Embodiment 2

This embodiment is characterized in that a semiconductor containing an oxychalcogenide (hereinafter referred to as "oxychalcogenide semiconductor") and a light emitting layer in which a compound semiconductor provided with a donor and an acceptor emits light are laminated so as to be adjacent to each other.

The use of an oxychalcogenide semiconductor instead of the chalcopyrite semiconductor of Embodiment 1 is also one favorable example. With such constitution, a DC drive type light emitting device capable of emitting light with high brightness even at not low temperatures can be obtained.

For example, as shown in FIG. 1, a light emitting device of this embodiment is obtained by laminating the anode 11 on the substrate 10 and laminating thereon the oxychalcogenide semiconductor 12, the donor-acceptor pair light emitter 13, and the cathode 14.

As described above, the layer constituted of the chalcopyrite semiconductor in Embodiment 1 favorably is of a wide gap semiconductor which is transparent in a visible light region. An oxychalcogenide is a favorable material because the oxychalcogenide contains oxygen and hence the band gap of the oxychalcogenide generally tends to be wider than that of the chalcopyrite (sulfide material) described above. In addition, the oxychalcogenide semiconductor is a favorable material because it is generally of the p-type conduction type. On the other hand, the carrier transporting property of the oxychalcogenide semiconductor is inferior to that of the chalcopyrite semiconductor in some cases.

Phys. stat. sol. (a), 203, 2800-2811, (2006) reports LaCuOS (Eg=3.1) and LaCuOSe (Eg=2.8) as oxychalcogenides showing p-type conduction. Phys. stat. sol. (a), 203, 2800-2811, (2006) discloses a heterojunction diode obtained by laminating a p-type LaCuOSe oxychalcogenide semiconductor layer and an n-type InGaZn$_5$O$_8$ semiconductor layer.

The oxychalcogenide semiconductor of the present invention is not particularly limited as long as it contains an oxygen element (O) and a chalcogen element (S, Se, or Te) as its main components. Further, an oxychalcogenide semiconductor containing a Cu element as its main component is favorable because it shows good p-type electric conducting property. In particular, a hole can be injected into a ZnS-based donor-acceptor pair light emitter. This is probably because a hole can be effectively injected from the valence band formed by a hybrid orbital of Cu and S. Of the chalcogen elements, S is favorably used because the largest band gap can be obtained.

The term "main component" as used herein refers to a component the content of which is at least 1 mol % or more in terms of atomic composition ratio.

The oxychalcogenide semiconductor of the present invention may be of a crystalline or amorphous structure. Examples of the semiconductor when a crystal is applied include LaCuOS and LaCuOSe.

When it is amorphous, an arbitrary ratio is applicable to the element composition ratio. For example, an La—Cu—O—S-based material can be represented by a chemical formula La$_x$Cu$_y$O$_z$S$_\delta$, and each of x, y, z, and δ can take an arbitrary value (except zero).

The ratio (z/δ) of the oxygen element (O) to the chalcogen element is favorably in the range of 0.1 to 10. Other examples of the semiconductor material include Al—Cu—O—S-based, Ga—Cu—O—S-based, Y—Cu—O—S-based, In—Cu—O—S-based, Bi—Cu—O—S-based, Zn—Cu—O—S-based, Sn—Cu—O—S-based, and Cu—O—S-based materials. While materials with one or two kinds of metal elements have been listed here, an arbitrary material with three or more kinds of metal elements is also applicable.

Such amorphous semiconductor allows a wide range of element combinations and a wide range of composition ratios. In addition, such amorphous semiconductor is favorable because it can be formed into a thin film at a relatively low temperature as compared to a crystal. In addition, good carrier transferring property can be expected because it is free of any influence of a grain boundary present in a polycrystalline thin film.

Examples of a method of forming the oxychalcogenide semiconductor of this embodiment include a multi-source deposition method, a sulfidization, selenidization, or tellurization method, a solid phase growth method, a metal organic chemical vapor deposition method, a vapor phase growth method, a sputtering method, and a laser ablation method. Of those, the multi-source deposition method is advantageous in terms of composition controllability, and the sputtering method is effective in terms of convenience.

For example, an LaCuOS polycrystalline thin film or an La—Cu—O—S-based amorphous thin film can be formed by a sputtering method involving the use of La$_2$O$_3$ and Cu2S as targets. Alternatively, the LaCuOS polycrystalline thin film or the La—Cu—O—S-based amorphous thin film can be formed by a sputtering method involving the use of the sintered product of a mixture of, for example, La$_2$O$_3$, La$_2$S$_3$, and Cu$_2$S mixed at a desired composition ratio as a target.

An approach involving forming an amorphous film and subjecting the film to an annealing treatment to make the film polycrystalline may be employed as an approach to obtaining a polycrystalline film.

The light emitting device of this embodiment is a DC drive type light emitting device in which an electrode on the side of the oxychalcogenide semiconductor is connected to a positive electrode and an electrode on the side of the donor-acceptor pair light emitter is connected to a negative electrode so that the donor-acceptor pair light emitter emits light.

That is, the light emitting device is of the same constitution as that shown in FIG. 1 described in Embodiment 1, provided that reference numeral 12 represents the oxychalcogenide semiconductor in this embodiment.

That is, when a DC voltage is applied to the light emitting device as shown in FIG. 1, a hole is supplied from the anode 11 on the side of the oxychalcogenide semiconductor, and an electron is supplied from the cathode 14 on the side of the donor-acceptor pair light emitter 13, whereby the donor-acceptor pair light emitter 13 emits light.

The oxychalcogenide semiconductor is favorably placed between an oxide transparent electrode typified by ITO and a light emitting layer using a sulfide as its base material. Since both oxygen as a constituent material of the oxide transparent electrode and sulfur as the main constituent element of the sulfide light emitting layer are contained, a light emitting device that does not show a large property fluctuation against, for example, element diffusion can be realized.

An oxychalcogenide semiconductor layer 31 favorably has a thickness of 20 to 100 nm.

Here, a material described in Embodiment 1 is applicable to the donor-acceptor pair light emitter. For example, the light emitter is represented by ZnS:A,D, one or more materials are selected from Au, Ag, Cu, and N for an A (acceptor), and one or more materials are selected from Al, Ga, In, F, Cl, Br, and I for a D (donor). Although there are various kinds of donor-acceptor combinations, a material in common with an element selected from the elements for constituting the oxychalcogenide semiconductor is favorably selected. This is because such selection enables the formation of the donor-acceptor pair light emitter caused by material diffusion from an oxychalcogenide in a heat treatment step in the method of producing a light emitting device. In addition, a stable device that shows small changes in properties in association with element diffusion upon driving can be realized.

Examples of a material for the anode 11 include metals each having a large work function close to the valence band of the oxychalcogenide semiconductor such as Pt, Ni, Au, ITO, Cu, and Pd. A transparent conductive electrode formed of an oxide typified by ITO is particularly favorable.

Examples of a material for the cathode 14 include alkali metals, alkali earth metals, materials belonging to the group III, and n-type semiconductors each having a small work function such as Li, Ca, Mg, Al, LiF/Al, MgAg/Ag, and ZnO:Al. However, the examples are not limited to them, and an arbitrary conductive material is applicable.

With such constitution, as shown in FIG. 2, the hole 16 is supplied and transported from the anode 11 into the oxychalcogenide semiconductor 12, and the electron 17 is supplied from the cathode 14. Then, the hole and the electron recombine in the donor-acceptor pair light emitter 13, whereby the light emission 15 having high brightness can be obtained.

Alternatively, a light emitting device having any one of the constitutions shown in FIGS. 3 to 8 described above in Embodiment 1 can be constituted, provided that reference numeral 12 represents the oxychalcogenide semiconductor in this embodiment.

The following approach is favorably employed upon formation of the light emitting device.

That is, a precursor in which a base material 22 for a donor-acceptor pair light emitter and an oxychalcogenide semiconductor 12 are placed so as to be adjacent to each other is prepared, and is subjected to a heat treatment. The heat treatment causes material diffusion from the oxychalcogenide semiconductor 12 toward the base material 22 for a donor-acceptor pair light emitter, whereby the donor-acceptor pair light emitter 13 can be formed.

Although the heat treatment can be performed with, for example, a general electric furnace as long as the atmosphere for the treatment can be controlled, the treatment is favorably performed by a rapid heating method with which a time period for heating and cooling can be controlled in order that the extent or range of material diffusion due to heat may be controlled with improved accuracy. In addition, a lamp or laser as well as a heater may be used as heating means.

EXAMPLES

Hereinafter, the present invention will be described in more detail by way of examples. However, the present invention is not limited to the following examples.

Example 1

This example is a first example of the production of a light emitting device having a chalcopyrite semiconductor and a donor-acceptor pair light emitter.

Pt is formed into a film as the anode 11 on a GaP (100) substrate as the substrate 10. The film, which has a thickness of 100 nm, is formed by using a magnetron sputtering device and a Pt target in a stream of an argon gas under a pressure of 1 Pa at a film deposition rate of 10 nm/min.

In any subsequent step, a multi-source vacuum deposition device capable of supplying a hydrogen sulfide gas and provided with a resistance heating evaporation source and an electron gun evaporation source is used.

First, the temperatures of the resistance heating evaporation sources of Cu, Al, and S for obtaining $CuAlS_2$ of the chalcopyrite semiconductor 12 are set to 1,000° C., 1,100° C., and 60° C., respectively.

Then, the substrate temperature is kept at 600° C., and deposition is conducted to have a thickness of 1 μm in a stream of an $H_2S$ gas under a pressure of $1\times10^{-2}$ Pa at a film deposition rate of 2 nm/sec.

Next, ZnS as a base material for a donor-acceptor pair light emitter is deposited to a thickness of 100 nm by using an electron gun evaporation source under a pressure of $1\times10^{-3}$ Pa while the substrate temperature is kept at 200° C.

After the film formation, the resultant is subjected to a heat treatment in a tubular annealing furnace made of quartz at 600° C. for 20 minutes while a mixed gas of an argon gas and hydrogen sulfide is flowed into the furnace, whereby the donor-acceptor pair light emitter 13 is formed.

After that, $In_2O_3$:ZnO is deposited to a thickness of 400 nm to serve as the cathode 14 by using a magnetron sputtering device and an $In_2O_3$:ZnO (90:10 wt %) target in a stream of an argon gas under 1 Pa at a film deposition rate of 10 nm/min.

In the light emitting device thus produced, a positive electrode is connected to the Pt electrode, and a negative electrode is connected to the ZnO:Al electrode so that the device is driven by a direct current. As a result, the light emission 15 having a green color and having a peak wavelength at about 2.4 eV based on a ZnS:Cu,Al donor-acceptor pair can be obtained.

Example 2

This example is a second example of the production of a light emitting device having a chalcopyrite semiconductor and a donor-acceptor pair light emitter.

As shown in FIG. 3, ITO is deposited to a thickness of 500 nm to serve as a transparent electrode 19 on a quartz substrate as the transparent substrate 18 by using a magnetron sputtering device and an ITO ($SnO_2$=5 wt %) target in a stream of an argon gas under a pressure of 1 Pa at a film deposition rate of 15 nm/min.

In any subsequent step, a multi-source vacuum deposition device capable of supplying a hydrogen sulfide gas and provided with a resistance heating evaporation source and an electron gun evaporation source is used.

First, Ag and $Ga_2S_3$ for obtaining $AgGaS_2$ of the chalcopyrite semiconductor 12 are used as electron gun evaporation sources, and are supplied at 0.8 nm/sec and 3.2 nm/sec, respectively.

Then, the substrate temperature is kept at 300° C., and deposition is conducted to have a thickness of 1 μm in a stream of an $H_2S$ gas under a pressure of $1\times10^{-2}$ Pa at a film deposition rate of 4 nm/sec.

Subsequently, the resultant is held in the device for 30 minutes in a stream of an $H_2S$ gas under a pressure of $2\times10^{-2}$ Pa while the substrate temperature is kept at 600° C.

Next, ZnS as a base material for a donor-acceptor pair light emitter is deposited to a thickness of 100 nm by using an electron gun evaporation source under a pressure of $1\times10^{-3}$ Pa while the substrate temperature is kept at 200° C.

Thereafter, the resultant is subjected to a heat treatment at 500° C. for 10 seconds while a mixed gas of an argon gas and hydrogen sulfide is allowed to flow by using an infrared lamp annealing device, whereby the donor-acceptor pair light emitter 13 is formed.

After that, Al is deposited to a thickness of 100 nm to serve as the cathode 14 by using a vacuum deposition device at a film deposition rate of 20 nm/min.

In the light emitting device thus produced, a positive electrode is connected to the ITO electrode, and a negative electrode is connected to the Al electrode so that the device is driven by a direct current. As a result, the light emission 15 having a blue color and having a peak wavelength at about 2.7 eV can be obtained.

Example 3

This example is a third example of the production of a light emitting device having a chalcopyrite semiconductor and a donor-acceptor pair light emitter.

As shown in FIG. 4, Ni is deposited to a thickness of 200 nm to serve as the anode 11 on a soda lime glass substrate as the substrate 10 by using a magnetron sputtering device and an Ni target in a stream of an argon gas under a pressure of 1 Pa at a film deposition rate of 10 nm/min.

In any subsequent step, a multi-source vacuum deposition device provided with a resistance heating evaporation source and an electron gun evaporation source is used.

The temperatures of the resistance heating evaporation sources of Cu and In are set to 1,000° C. and 80° C., respectively, and a Cu layer having a thickness of 100 nm and an In layer having a thickness of 100 nm are alternately formed under a pressure of $1 \times 10^{-3}$ Pa in such a manner that the total number of layers becomes four, that is, the total thickness of the layers becomes 400 nm.

After that, in a stream of an $H_2S$ gas, the substrate temperature is increased to 500° C., and then the resultant is annealed for 30 minutes to be turned into $CuInS_2$, whereby the chalcopyrite semiconductor 12 is formed.

Next, a pellet obtained by adding $5 \times 10^{-4}$ mol/mol of Al to ZnS as a base material for a donor-acceptor pair light emitter is used as an electron gun evaporation source.

Then, the substrate temperature is kept at 200° C., and deposition is conducted to have a thickness of 100 nm under a pressure of $1 \times 10^{-3}$ Pa.

Thereafter, the resultant is subjected to a heat treatment at 500° C. for 20 seconds while a mixed gas of an argon gas and hydrogen sulfide is allowed to flow by using an infrared lamp annealing device, whereby the donor-acceptor pair light emitter 13 is formed.

After that, InGaZnO4 is deposited to a thickness of 100 nm to serve as the n-type semiconductor 21 by using a magnetron sputtering device and an InGaZnO4 target in a stream of an argon gas under 1 Pa at a film deposition rate of 10 nm/min.

Further, ZnO:Al is deposited to a thickness of 400 nm to serve as the cathode 14 by using a magnetron sputtering device and a ZnO:Al ($Al_2O_3$=2 wt %) target in a stream of an argon gas under 1 Pa at a film deposition rate of 10 nm/min.

In the light emitting device thus produced, a positive electrode is connected to the Ni electrode, and a negative electrode is connected to the ZnO:Al electrode so that the device is driven by a direct current. As a result, the light emission 15 having a green color and having a peak wavelength at about 2.4 eV can be obtained.

Example 4

This example is a fourth example of the production of a light emitting device having a chalcopyrite semiconductor and a donor-acceptor pair light emitter.

As shown in FIG. 6, the device is produced on a p-type GaP (100) substrate as the p-type semiconductor 23 by using a multi-source vacuum deposition device provided with a resistance heating evaporation source and an electron gun evaporation source.

First, the temperatures of the resistance heating evaporation sources of Cu, Al, and Se for the chalcopyrite semiconductor 12 are set to 1,050° C., 1,100° C., and 210° C., respectively.

Then, the substrate temperature is kept at 300° C., and deposition is conducted to have a thickness of 500 nm under a pressure of $1 \times 10^{-3}$ Pa at a film deposition rate of 0.5 nm/sec.

After that, the substrate temperature is increased to 500° C., and the resultant is annealed for 1 hour, whereby $CuAlSe_2$ is formed.

Next, ZnS as a base material 22 for a donor-acceptor pair light emitter is deposited to a thickness of 100 nm by using an electron gun evaporation source under a pressure of $1 \times 10^{-3}$ Pa while the substrate temperature is kept at 200° C.

Thereafter, the resultant is subjected to a heat treatment at 600° C. for 20 seconds while a mixed gas of an argon gas and hydrogen sulfide is allowed to flow by using an infrared lamp annealing device, whereby the donor-acceptor pair light emitter 13 is formed.

After that, ZnO:Ga is deposited to a thickness of 400 nm to serve as the cathode 14 by using a magnetron sputtering device and a Zno:Ga ($Ga_2O_3$=3 wt %) target in a stream of an argon gas under 1 Pa at a film deposition rate of 10 nm/min.

Further, Au is deposited to a thickness of 100 nm to serve as the anode 11 on the back surface of the p-type semiconductor 23 by using the vacuum deposition device at a film deposition rate of 20 nm/min.

In the light emitting device thus produced, a positive electrode is connected to the Au electrode, and a negative electrode is connected to the ZnO:Ga electrode so that the device is driven by a direct current. As a result, the light emission 15 having a green color and having a peak wavelength at about 2.4 eV based on a ZnS:Cu,Al donor-acceptor pair can be obtained.

Example 5

This example is a fifth example of the production of a light emitting device having a chalcopyrite semiconductor and a donor-acceptor pair light emitter.

As shown in FIG. 8, Ni is deposited to a thickness of 200 nm to serve as the anode 11 on a soda lime glass substrate as the substrate 10 by using a magnetron sputtering device and an Ni target in a stream of an argon gas under a pressure of 1 Pa at a film deposition rate of 10 nm/min.

Further, using a Cu—Ga (Ga=40 wt %) target deposition is conducted to have a thickness of 600 nm to serve as the chalcopyrite semiconductor 12.

After that, the resultant is subjected to a heat treatment in a tubular annealing furnace made of quartz at 500° C. for 30 minutes while a mixed gas of an argon gas and hydrogen sulfide is flowed into the furnace, whereby $CuGaS_2$ is formed.

ZnS as a base material for a donor-acceptor pair light emitter is grown by a solution growth method to have a thickness of 100 nm on the resultant. The solution growth method is performed as described below.

The substrate is immersed for 5 minutes in a solution of 80° C. prepared by dissolving 0.025 M of zinc acetate $Zn(CH_3COO)_2$ and 0.375 M of thiourea $[SC(NH_2)_2]$ in 2.5 M of ammonium hydroxide $NH_4OH$.

Then, a nitrogen gas is blown to the surface of the substrate, and the whole is dried. After that, a mixed gas of an argon gas and hydrogen sulfide is flowed by using an infrared lamp annealing device.

Then, the resultant is subjected to a heat treatment at 500° C. for 20 seconds, whereby the donor-acceptor pair light emitter 13 is formed.

After that, ZnS is deposited to a thickness of 30 nm to serve as the insulator 20 by using a vacuum deposition device and an electron gun evaporation source under a pressure of $1 \times 10^{-3}$ Pa while the substrate temperature is kept at 300° C.

After that, ZnO:Al is deposited to a thickness of 400 nm to serve as the cathode 14 by using a magnetron sputtering device and a ZnO:Al (Al$_2$O$_3$=2 wt %) target in a stream of an argon gas under 1 Pa at a film deposition rate of 10 nm/min.

In the light emitting device thus produced, a positive electrode is connected to the Ni electrode, and a negative electrode is connected to the ZnO:Al electrode so that the device is driven by a direct current. As a result, the light emission 15 having a green color and having a peak wavelength at about 2.4 eV based on a ZnS:Cu,Ga donor-acceptor pair can be obtained.

Example 6

This example is an example of a light emitting device having a polycrystalline oxychalcogenide semiconductor and a donor-acceptor pair light emitter.

The structure of the light emitting device is as shown in FIG. 1.

Pt is deposited as the anode 11 on a GaP (100) substrate as the substrate 10. The deposition is conducted to a thickness of 100 nm by using a magnetron sputtering device and a Pt target in a stream of an argon gas under a pressure of 1 Pa at a film deposition rate of 10 nm/min.

Next, the oxychalcogenide semiconductor layer 12 formed of LaCuOS is formed. An LaCuOS layer having a thickness of 50 nm was formed by a co-sputtering method involving the use of La$_2$O$_3$ and CuS targets. The substrate temperature is room temperature, and a mixed atmosphere of Ar and H$_2$S having a pressure of 0.5 Pa (Ar:H$_2$S=19:1) is used.

Subsequently, the LaCuOS film is crystallized by being subjected to an annealing treatment at a substrate temperature of 700° C. for 20 minutes in a stream of an H$_2$S gas under a pressure of 1×10$^{-2}$ Pa.

Next, ZnS as a base material for a donor-acceptor pair light emitter is deposited to a thickness of 100 nm by using an electron gun evaporation source under a pressure of 1×10$^{-3}$ Pa while the substrate temperature is kept at 200° C.

Thereafter, the resultant is subjected to a heat treatment in a tubular annealing furnace made of quartz at 600° C. for 20 minutes while a mixed gas of an argon gas and hydrogen sulfide is allowed to flow into the furnace, whereby the donor-acceptor pair light emitter 13 is formed.

After that, ZnO:Al is deposited to a thickness of 400 nm to serve as the cathode 14 by using a magnetron sputtering device and a ZnO:Al (Al$_2$O$_3$=2 wt %) target in a stream of an argon gas under 1 Pa at a film deposition rate of 10 nm/min.

In the light emitting device thus produced, a positive electrode is connected to the Pt electrode, and a negative electrode is connected to the ZnO:Al electrode so that the device is driven by a direct current. As a result, the light emission 15 having a green color and having a peak wavelength at about 2.4 eV based on a ZnS:Cu,Al donor-acceptor pair can be obtained.

Example 7

This example is an example of a light emitting device having an oxychalcogenide semiconductor and a donor-acceptor pair light emitter. The structure of the light emitting device is as shown in FIG. 3.

ITO is deposited as the transparent electrode 19 on a quartz substrate as the transparent substrate 18. The deposition is conducted to have a thickness of 500 nm by using a magnetron sputtering device and an ITO (SnO$_2$=5 wt %) target in a stream of an argon gas under a pressure of 1 Pa at a film deposition rate of 15 nm/min.

Next, the oxychalcogenide semiconductor layer 12 formed of LaCuOS is formed. An LaCuOS layer having a thickness of 60 nm is formed by a sputtering method involving the use of a sintered material target formed of La$_2$S$_3$, La$_2$O$_3$, and Cu$_2$S.

Next, a base material for a donor-acceptor pair light emitter is deposited by using a multi-source vacuum deposition device capable of supplying a hydrogen sulfide gas and provided with a resistance heating evaporation source and an electron gun evaporation source. A pellet obtained by adding 5×10$^{-4}$ mol/mol of Ag to ZnS as the base material for a donor-acceptor pair light emitter is used as an electron gun evaporation source. The deposition is conducted to have a thickness of 100 nm under a pressure of 1×10$^{-3}$ Pa while the substrate temperature is kept at 200° C.

Thereafter, the resultant is subjected to a heat treatment at 500° C. for 10 seconds while a mixed gas of an argon gas and hydrogen sulfide is allowed to flow by using an infrared lamp annealing device, whereby the donor-acceptor pair light emitter 13 is formed.

After that, Al is deposited to a thickness of 100 nm to serve as the cathode 14 by using the vacuum deposition device at a film deposition rate of 20 nm/min.

In the light emitting device thus produced, a positive electrode is connected to the ITO electrode, and a negative electrode is connected to the Al electrode so that the device is driven by a direct current. As a result, the light emission 15 having a blue color and having a peak wavelength at about 2.7 eV can be obtained.

Example 8

This example is an example of a light emitting device having an oxychalcogenide semiconductor and a donor-acceptor pair light emitter.

ITO is deposited as the transparent electrode 19 on a quartz substrate as the transparent substrate 18. The deposition is conducted to have a thickness of 500 nm by using a magnetron sputtering device and an ITO (SnO$_2$=5 wt %) target in a stream of an argon gas under a pressure of 1 Pa at a film deposition rate of 15 nm/min.

Next, a base material for a donor-acceptor pair light emitter is deposited by using a multi-source vacuum deposition device capable of supplying a hydrogen sulfide gas and provided with a resistance heating evaporation source and an electron gun evaporation source. A pellet obtained by adding 5×10$^{-4}$ mol/mol of Cu and Al to ZnS as the base material for a donor-acceptor pair light emitter is used as an electron gun evaporation source. The deposition is conducted to have a thickness of 100 nm under a pressure of 1×10$^{-3}$ Pa while the substrate temperature is kept at 200° C.

Thereafter, the resultant is subjected to a heat treatment at 500° C. for 10 seconds while a mixed gas of an argon gas and hydrogen sulfide is allowed to flow by using an infrared lamp annealing device, whereby the donor-acceptor pair light emitter 13 is formed.

Next, the oxychalcogenide semiconductor layer 12 which includes Al—Cu—O—S and is amorphous is formed. An Al—Cu—O—S layer having a thickness of 30 nm is formed by a co-sputtering method involving the use of Al$_2$O$_3$ and Cu$_2$S targets. The layer is formed in such a manner that the composition ratio Al:Cu:O:S becomes about 1:1:1:1.

After that, Ni is deposited to a thickness of 100 nm to serve as the anode by using the vacuum deposition device at a film deposition rate of 20 nm/min.

In the light emitting device thus produced, a negative electrode is connected to the ITO electrode, and a positive electrode is connected to the Ni electrode so that the device is driven by a direct current. As a result, the emitted light having a blue color and having a peak wavelength at about 2.4 eV can be obtained.

The present invention can be utilized in an LED or an organic EL.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2006-074626, filed Mar. 17, 2006, and 2007-061869, filed Mar. 12, 2007, which are hereby incorporated by reference herein in their entirety.

The invention claimed is:

1. A light emitting device, comprising:
a pair of electrodes;
a light emitter placed between the electrodes; and
a semiconductor laminated to be adjacent to the light emitter,
wherein the semiconductor includes one of a chalcopyrite and an oxychalcogenide,
wherein a constituent material of the light emitter is represented by ZnS:A (acceptor), D (donor), and at least one material is selected from Au, Ag, Cu, N, O, S, Se, and Te for the A (acceptor), and at least one material is selected from Al, Ga, In, F, Cl, Br, I, O, S, Se, and Te for the D (donor),
wherein the chalcopyrite is represented by a I-III-$VI_2$ type, and a group I material thereof is selected from Cu and Ag, a group III material thereof is selected from Al, Ga, and In, and a group VI material thereof is selected from S, Se, and Te, and
wherein the at least one material corresponding to the A (acceptor) and the at least one material D (donor) are diffused from the chalcopyrite or the oxychalcogenide due to a heat treatment.

2. A light emitting device according to claim 1, wherein at least one of the A (acceptor) and the D (donor) includes:
same materials as the group I materials and the group III materials, which are included in the chalcopyrite, when the semiconductor includes the chalcopyrite, and
a same material as a material included in the oxychalcogenide, when the semiconductor includes the oxychalcogenide.

3. A light emitting device according to claim 1, wherein the A (acceptor) and the D (donor) have a concentration of $10^{-3}$ mol/mol or less.

4. A light emitting device according to claim 1, wherein:
the chalcopyrite is represented by a I-III-$S_2$ type; and
a group I material of the chalcopyrite is selected at least from Cu and Ag, and a group III material of the chalcopyrite is selected at least from Al and Ga.

5. A light emitting device according to claim 1, wherein:
the at least one material for the A (acceptor) is selected at least from Ag and Cu, and at least one material for the D (donor) is selected from Al, Ga, and Cl.

6. A light emitting device according to claim 1, wherein lattice matching between the chalcopyrite or the oxychalcogenide and a material included in the light emitter is 10% or less.

7. A light emitting device according to claim 1, wherein the semiconductor is provided on an anode side of the light emitter, and a positive electrode of a DC power supply is connected to an anode and a negative electrode of the DC power supply is connected to a cathode so that light is emitted.

8. A light emitting device according to claim 1, wherein the oxychalcogenide includes an amorphous material.

9. A light emitting device according to claim 1, wherein the light emitter includes a compound having a crystalline structure of a sphalerite structure.

* * * * *